United States Patent [19]
Loy et al.

[11] Patent Number: 5,940,009
[45] Date of Patent: Aug. 17, 1999

[54] APPARATUS AND METHOD TO DETECT TAMPERING WITH AN ELECTRONIC UTILITY METER

[75] Inventors: Garry M. Loy; Kenneth C. Shuey; Mark L. Munday; Rodney C. Hemminger, all of Raleigh, N.C.

[73] Assignee: ABB Power T&D Company Inc., Raleigh, N.C.

[21] Appl. No.: 08/925,542

[22] Filed: Sep. 8, 1997

[51] Int. Cl.[6] .................................................. G08B 23/00
[52] U.S. Cl. ................... 340/870.02; 340/568; 340/571; 324/110; 364/483
[58] Field of Search ...................... 340/870.02, 870.03, 340/568, 571; 324/110; 364/483; 375/200; 250/222.1

[56] References Cited

U.S. PATENT DOCUMENTS

| | | | |
|---|---|---|---|
| 4,331,915 | 5/1982 | Fielden | 324/110 |
| 4,565,995 | 1/1986 | Stokes | 340/571 |
| 4,571,691 | 2/1986 | Kennon | 364/483 |
| 4,727,315 | 2/1988 | Jones | 324/110 |
| 4,764,952 | 8/1988 | Feliu | 379/107 |
| 5,086,292 | 2/1992 | Johnson et al. | 340/637 |
| 5,293,115 | 3/1994 | Swanson | 324/110 |
| 5,345,225 | 9/1994 | Davis | 340/635 |
| 5,422,565 | 6/1995 | Swanson | 324/110 |
| 5,473,322 | 12/1995 | Carney | 340/870.02 |
| 5,488,565 | 1/1996 | Kennon et al. | 364/483 |
| 5,523,559 | 6/1996 | Swanson | 250/222.1 |
| 5,553,084 | 9/1996 | Johnson et al. | 375/200 |

FOREIGN PATENT DOCUMENTS 2 260 415   9/1992   United Kingdom .

*Primary Examiner*—Michael Horabik
*Assistant Examiner*—Albert K. Wong
*Attorney, Agent, or Firm*—Woodcock Washburn Kurtz Mackiewicz & Norris LLP

[57] ABSTRACT

An apparatus and method for detecting tampering with an electrical energy meter comprising a disconnect switch, interposed into feeder lines that deliver electrical energy from a voltage source to an electrical load, which switches between an open circuit in which electrical energy is not supplied to the electrical load and a closed circuit in which electrical energy is supplied to the electrical load, a load-side voltage sensor, which provides voltage signals indicative of load-side voltage, and a microprocessor that determines whether a tamper conditions exists by determining whether the disconnect switch is open or closed, determining whether a load-side voltage is present, and, if the disconnect switch is open and a load-side voltage is present, indicating that a tamper condition exists. The tamper detection apparatus preferably includes a communications module, connected to the microprocessor, for providing a two-way communications interface to a remote location. In this embodiment, if the microprocessor determines that a tamper condition exists, the microprocessor transmits to the remote location a message indicating that a tamper condition exists. The communications module may also open or close the disconnect switch in response to open and close commands from the remote location. This feature permits remote polling of the meter to determine if a tamper condition is present.

11 Claims, 3 Drawing Sheets

APPARATUS AND METHOD TO DETECT TAMPERING WITH AN ELECTRONIC UTILITY METER

BACKGROUND OF THE INVENTION

1. Field of the Invention

This invention relates generally to electronic utility metering devices and, more specifically, to an apparatus and method to detect tampering with an electronic utility meter device having an internal disconnect switch.

2. Description of the Prior Art

Electrical metering of residential energy has historically been accomplished using electromechanical meters that sense electromagnetic fields in proximity to voltage coils and current carrying conductors. These electromechanical meters are generally effective in metering electrical energy consumption, but are incapable of providing, in a cost effective manner, numerous additional functions currently being demanded by the utility industry. For example, modem utility companies desire metering devices capable of metering not only total energy consumption, but also many other electrical parameters (e.g., time-of-use).

The industry has responded to this demand by developing completely electronic metering devices. Electronic meters cost effectively provide the utility with measurements of a number of electrical parameters, as well many other advantages. For example, to reduce the costs associated with reading meters, utility companies use electronic metering devices with built in communications modules capable of communicating meter reading data back to the utility's master station. Such communications networks obviate the need for human meter readers to go to individual subscriber locations to read meters.

Another function the utility industry demands of electronic metering devices is the capability to connect or disconnect service to individual subscriber locations. For a variety of reasons, utilities are routinely and frequently required to connect and disconnect service. For example, a utility may need to disconnect service when a subscriber moves out of a particular location and then later reconnect service to the same location when another subscriber moves in. Likewise, utility companies are sometimes forced to disconnect service to a subscriber who does not pay, and then reconnect service when the subscriber's account is settled. A number of electronic metering devices currently exist that provide connect/disconnect capability through the use of disconnect switches internal to the meter.

However, the utilities are typically forced to send a human to the subscriber location to connect or disconnect service by closing or opening the disconnect switch at the meter itself. This approach is particularly time-consuming (and, thus, costly) on college campuses, military bases, apartment complexes, and the like, where the rate of subscriber turnover is high.

The cost of connecting/disconnecting service is greatly reduced if the utility operates the internal disconnect switch from a remote location, such as the utility's master station. In this way, service could be routinely connected and disconnected to subscriber locations, without the utility expending the cost associated with sending a human to the site.

Unfortunately, many unscrupulous subscribers whose service has been disconnected have attempted to restore service themselves, without compensating the utility for the benefit, by tampering with the meter. One common tampering technique is to place a resistor in parallel with the meter, thus causing current to circumvent the meter (and the disconnect switch), essentially reconnecting the circuit without actually closing the disconnect switch.

FIG. 1 illustrates a typical electrical energy meter 10 with an internal disconnect switch 40. The meter 10 comprises a source side current sensor 30, a source side voltage sensor 32, a disconnect switch 40 containing two electromechanical solenoid driven switches 42 and 44, and a microprocessor 50.

Electrical energy (L1 in; L2 in) is supplied by a voltage source 12 and delivered, via source side feeder lines 20A and 20B, through meter 10, to an electrical load at a subscriber location 14. Disconnect switch 40 is interposed onto the feeder lines, separating source side feeder lines 20A and 20B from load side feeder lines 20C and 20D. The electrical energy delivered to the load on load side feeder lines 20C and 20D is given by L1 out and L2 out, respectively.

When disconnect switch 40 is closed, electrical energy (L1 out; L2 out) should be delivered to subscriber location 14, and when disconnect switch 40 is open, no electrical energy should be delivered to subscriber location 14.

In the situation in which a tamperer has installed lines 26A and 26B, current is delivered to the load at subscriber location 14, thereby circumventing meter 10. Although disconnect switch 40 is open, current will still be delivered to the subscriber location 14, but current sensor 30 will not detect the delivered current. Similarly, a line voltage will occur on the load side feeder lines 20C and 20D. However, since a source side voltage is always present, source side voltage sensor 32 is unable to detect the tampering. Thus, the subscriber will be supplied with electrical energy without the utility having the ability to meter the usage.

Similarly, if disconnect switch 40 is closed (i.e., the utility has not disconnected service to subscriber location 14), the tamperer might still provide himself with free electrical energy. In this case, lines 26A and 26B might be equipped with resistance such that some, but not all, of the delivered current would be delivered over lines 26A and 26B, circumventing current sensor 30. Thus, the utility would meter only a portion of the actual energy being delivered.

The industry has responded to the tampering problem by installing various tamper detection mechanisms into existing meters, or by developing meters with built-in tamper detection mechanisms. Many of these approaches attempt to detect tampering by measuring the current being drawn by the subscriber location (i.e., the load-side current), comparing the measured current to a predetermined expected value, and concluding whether or not less current is being drawn than expected. If it is concluded that too little current is being drawn, it is presumed that a tamper condition exists. This approach is highly subjective since one has to essentially guess at the expected current value. Further, since there are numerous reasons why a subscriber legitimately might be using less-than-usual current for a period of time, this approach tends to generate a large number of false alarms. Moreover, tamper detection mechanisms currently used in the art are expensive to implement, especially in residential environments where the per unit cost is multiplied by tens of thousands, or even millions of meters.

Thus, there is a need for a very low cost tamper detection mechanism for electronic meters with internal disconnect switches that uses an objective approach to determine whether a tamper condition exists at the meter.

SUMMARY OF THE INVENTION

The meter of the present invention overcomes the above described needs by providing an electronic meter with an internal disconnect switch, a two-way communications module, and an extremely cost-effective inherent tamper detection mechanism that relies on an objective approach to determining whether a tamper condition exists.

The meter of the present invention provides inherent tamper detection capability by employing a voltage sensor on the load side of the disconnect switch to determine whether a load side voltage exists. Using the presence of a load side voltage to determine whether a tamper condition exists is objective since, if the disconnect switch has been disconnected, there should be no load side voltage. On the other hand, if a load side voltage is present when the switch has been disconnected, there has likely been tampering.

More over, if the disconnect switch is connected, but the utility suspects tampering due to lower than expected current usage, the present invention provides a method to determine whether there has been a tampering without resorting to the subjective approaches of the prior art tamper detection devices.

According to the principles of the present invention, if a load side voltage exists when the disconnect switch is disconnected, the meter notifies the utility's master station via the communications module that a tamper condition exists. The utility can then take appropriate action.

Also, the extremely low per unit cost of a preferred embodiment of the tamper detection mechanism of the present invention fulfills the utilities' need for a tamper detection mechanism economically suitable for use in a residential installation.

BRIEF DESCRIPTION OF THE DRAWINGS

The present invention will be better understood, and its numerous objects and advantages will become apparent by reference to the following detailed description of the invention when taken in conjunction with the following drawings, where like reference numerals represent like elements, and in which.

DETAILED DESCRIPTION OF THE PREFERRED EMBODIMENTS

Figure 2:
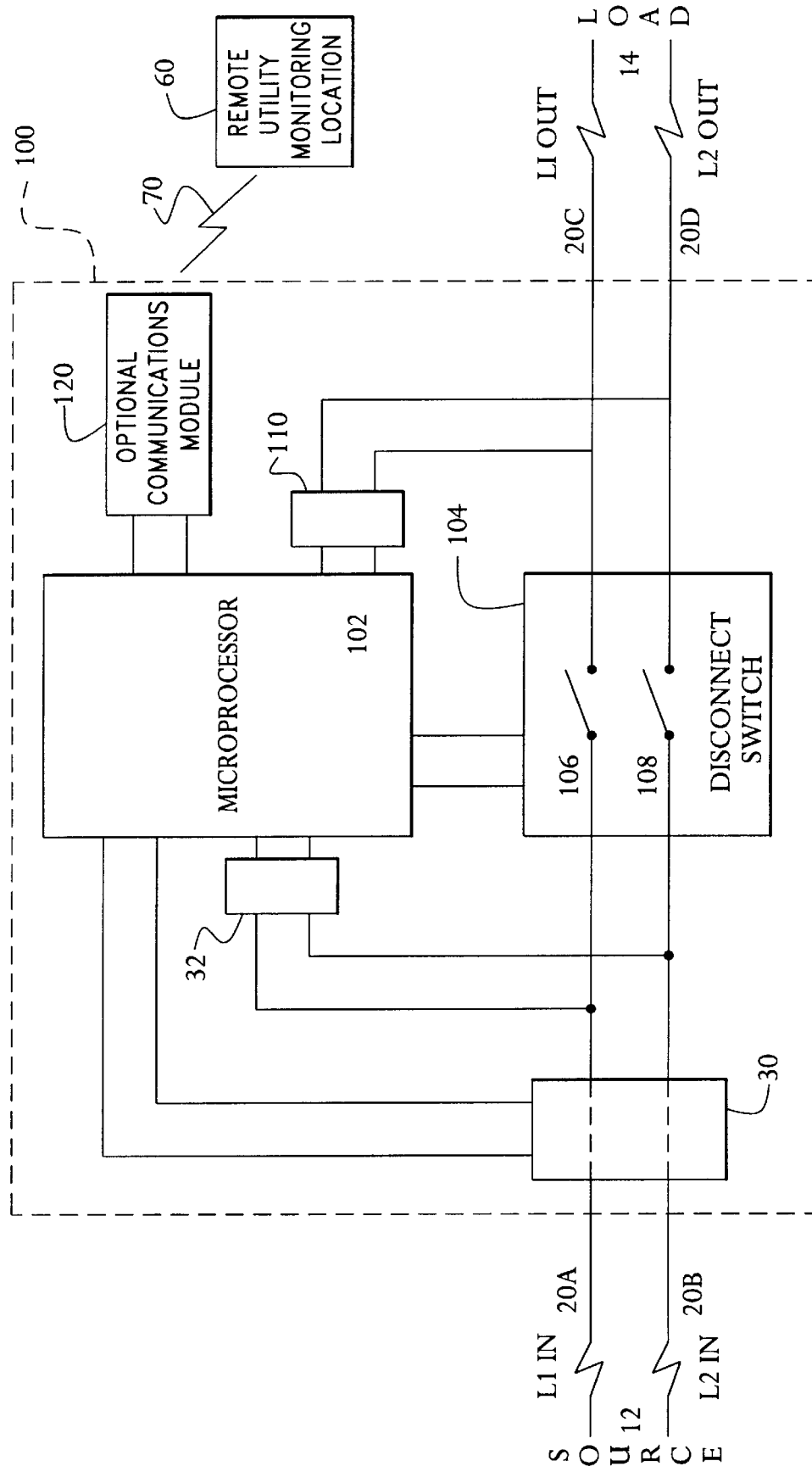
FIG. 2 shows a preferred embodiment of a meter of the present invention with an internal disconnect switch, communications module, and inherent tamper detection mechanism.

FIG. 2 shows a preferred embodiment of the meter of the present invention. The meter, generally referred to as 100, comprises the following components, the preferred embodiments and functions of which are described more fully below: a current sensor 30; a source side voltage sensor 32; a microprocessor 102; a disconnect switch 104 containing two electromechanical solenoid driven switches 106, 108; a load side voltage sensor 110, and an optional communications module 120.

Figure 1:
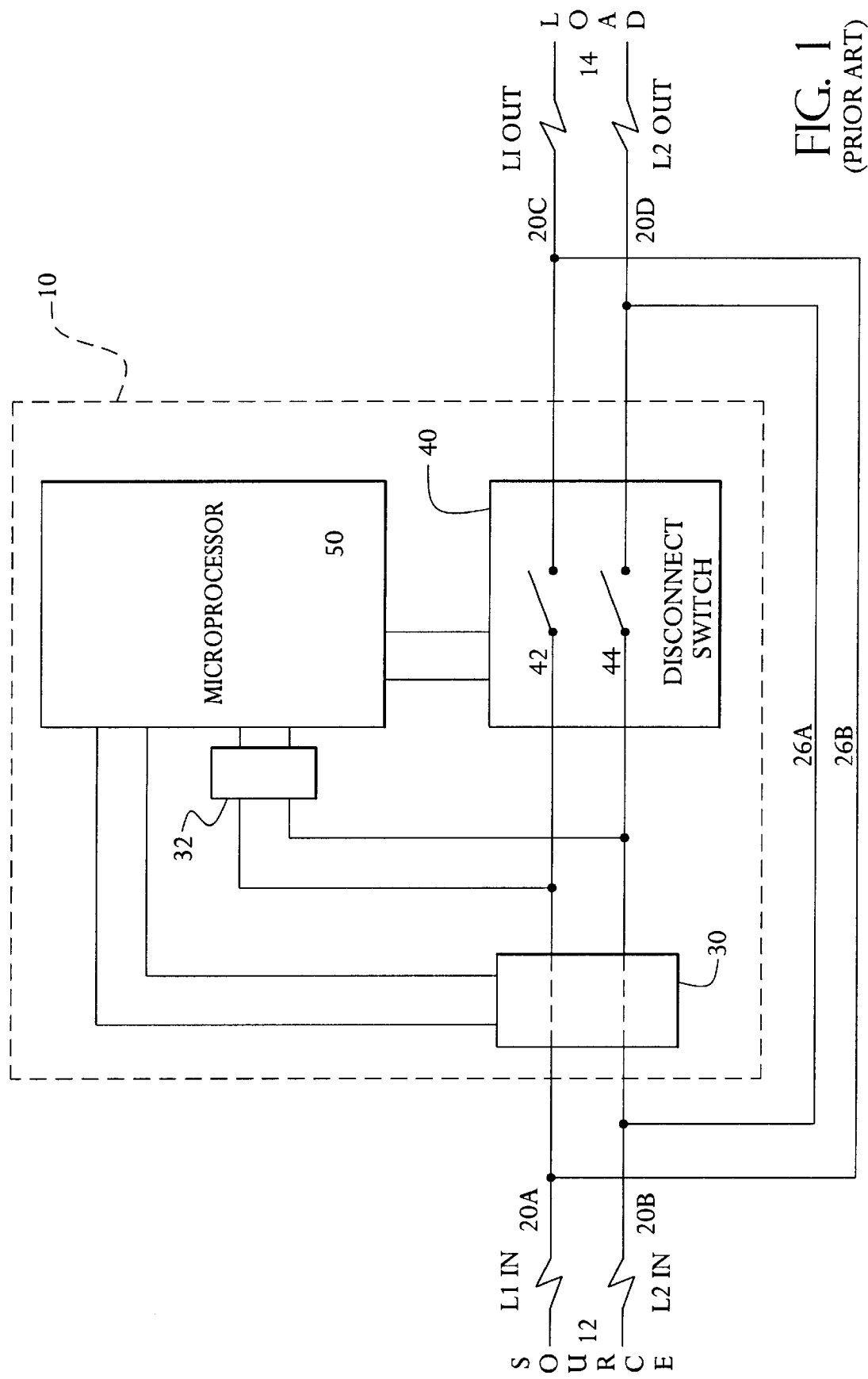
FIG. 1 shows a prior art utility meter with an internal disconnect switch.

As in the prior art embodiment shown in FIG. 1, electrical energy (L1 in; L2 in) is supplied by a voltage source 12 and delivered, via source side feeder lines 20A and 20B, through meter 100, to an electrical load at a subscriber location 14 (L1 out; L2 out). Disconnect switch 104 is interposed onto the feeder lines, separating the feeder lines into source side feeder lines 20A and 20B, and load side feeder lines 20C and 20D. When disconnect switch 104 is closed, electrical energy should be supplied to subscriber location 14, and when disconnect switch 104 is open, no electrical energy should be supplied to subscriber location 14.

Figure 3:
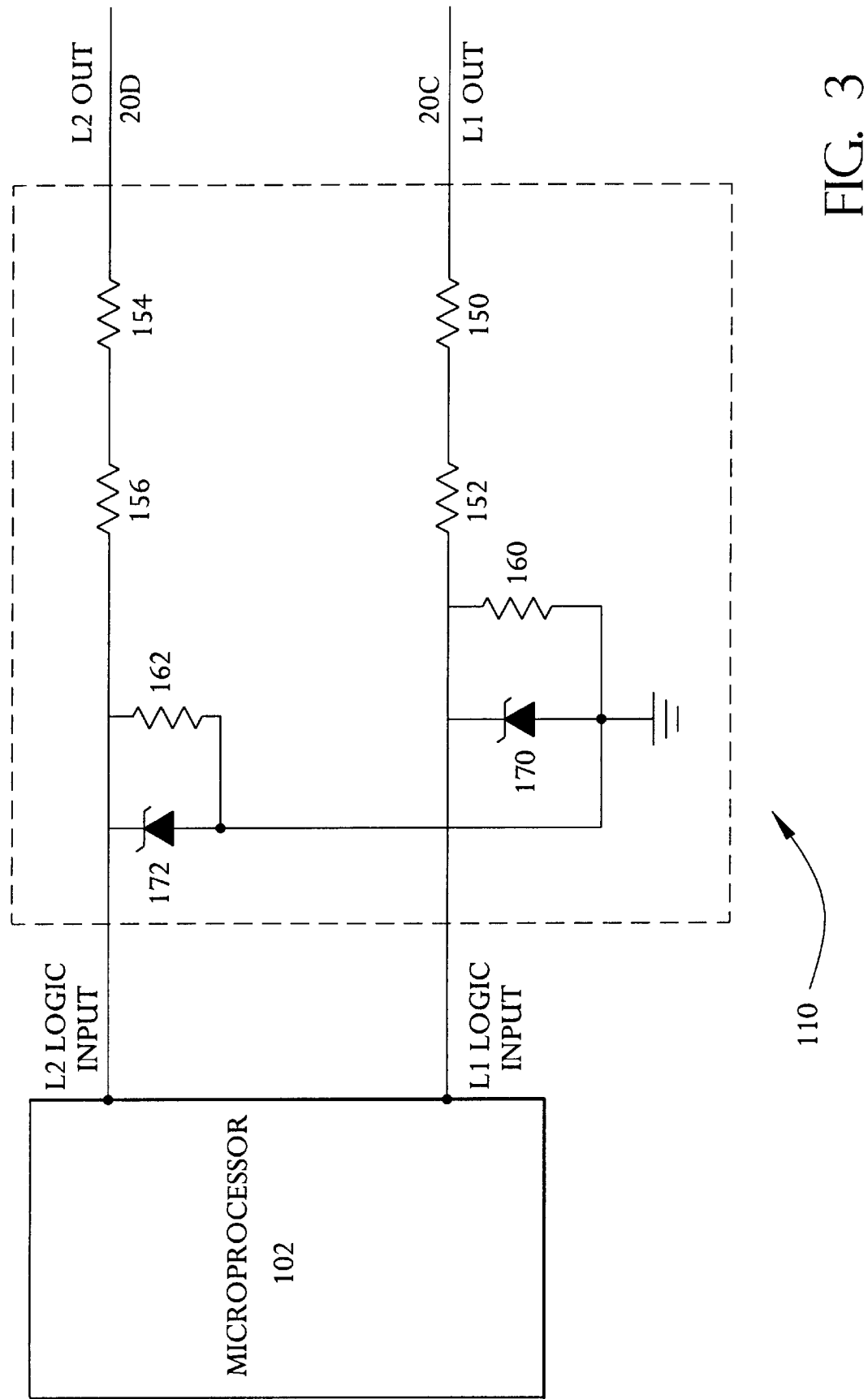
FIG. 3 shows a preferred embodiment of a load side voltage sensor used as a tamper detection mechanism according to the principles of the present invention.

In accordance with the present invention, load side voltage sensor 110 is connected to load side feeder lines 20C and 20D on the load side of disconnect switch 104 and provides voltage signals to microprocessor 102. As illustrated in FIG. 3, a preferred embodiment of a load side voltage sensor 110 comprises a pair of resistive dividers, each comprising two resistors 150/152 and 154/156, respectively. The resistors 150–156 are used to drop the load side voltage at an acceptable power loss. In a preferred embodiment, resistors 150–156 are 1 Meg, ½ watt resistors. Each resistor pair 150/152, 154/156 feeds a third resistor 160 and 162, respectively. Resistors 160 and 162 scale the input voltage into microprocessor 102 and are selected to provide logic level signals (L1 logic input; L2 logic input) to microprocessor 102. Zener diodes 170 and 172 protect the microprocessor 102 from both positive and negative voltage transients. The load side voltage sensor 110 illustrated in FIG. 3 is very inexpensive compared to other voltage sensing techniques currently in use and is thus presently preferred.

Referring once again to FIG. 2, microprocessor 102 accepts voltage signals from load side voltage sensor 110 and determines whether a load side voltage is present. If a load side voltage is present, then electrical energy is being supplied to the subscriber location. If no load side voltage is present, then electrical energy is not being supplied to the subscriber location.

It should be noted that, in general, microprocessor 102 provides functions in addition to tamper detection which are not aspects of the present invention, such as metering electrical energy consumption and other electrical parameters based on source side current and voltage signals provided by source side current sensor 30 and voltage sensor 32, respectively. In another preferred embodiment of the meter of the present invention, two microprocessors are used: a first, an analog-to-digital converter/digital signal processor (A/D-DSP) used for metering functions; and a second, a microcontroller, used for control functions.

Microprocessor 102 retains in its internal memory an indicator of whether disconnect switch 104 should be open or closed. In a preferred embodiment, the indicator is a single bit—set high, for example, if the switch should be open; set low if the switch should be closed. Thus, if the indicator bit is set high, the utility has disconnected disconnect switch 104 and no load side voltage should be present. On the other hand, if the indicator bit is set low, disconnect switch 104 is connected and a load side voltage should be present. Given the state of the indicator and the reading provided by load-side voltage sensor 110, microprocessor 102 can simply determine whether a tamper condition exists. A tamper condition exists when the indicator indicates that no load-side voltage should be present (e.g., indicator bit set high), but load-side voltage sensor 110 detects the presence of a load side voltage.

In a preferred embodiment of the present invention in which meter 100 does not include an optional communications module 120, if a tamper condition is detected, microprocessor 102 stores an indicator that a tamper condition was detected, along with the date and time of the detection. When a meter reader comes on site to read the meter, he also reads the tamper data. If he learns that a tamper condition exists, he can notify the utility.

In another preferred embodiment, meter 100 also includes an optional communications module 120 for communicating with a remote utility monitoring location 60. Optional communications module 120 is a two-way communications interface to the remote utility monitoring location 60 and may include any communications interface, such as a radiofrequency (RF) transceiver, or an interface to the telephone lines or power lines at the subscriber location, etc. Optional communication module 120 communicates with remote utility monitoring location 60 via communications link 70. Communications link 70 might be a private or public network.

In a preferred embodiment which includes optional communications module 120, if a tamper condition is detected, microprocessor 102 stores an indicator that a tamper condition was detected, along with the date and time of the detection. Using this preferred embodiment, the utility can request a remote meter reading. That is, the utility issues a read command from the remote utility monitoring location 60. In response, meter 100 transmits its meter data. However, in addition to transmitting the usage data normally transmitted in response to such read commands, the meter of the present invention can also transmit the indicator stored in microprocessor 102 indicating whether a tamper condition has been detected. In response to receiving such an indicator, the utility can act accordingly.

Also, in a preferred embodiment in which optional communications module 120 is present, microprocessor 102 can initiate transfer of a message through communications module 120 to the remote utility monitoring location if a tamper condition is detected. For example, in a preferred embodiment where the communications interface is to the subscriber's telephone lines, microprocessor 102 is programmed to dial into the remote utility monitoring location if it determines that a tamper condition exists. Microprocessor 102 transmits a signal across the telephone lines indicating that a tamper condition has been detected, along with the date and time the detection occurred, and any other information the utility might desire that is computed by or stored in the microprocessor. In response, the utility can investigate the situation and, if a tampering has occurred, the utility can correct the condition.

In a preferred embodiment in which a meter 100 is equipped with a communications module 120, the utility can also connect or disconnect the supply of electrical energy to a subscriber location from a remote location (e.g., from the master station). FIG. 2 shows a preferred embodiment in which disconnect switch 104 is connected to microprocessor 102. As shown, disconnect switch 104 comprises two switches 106 and 108 interposed into feeder lines 20A–20C and 20B–20D, respectively. Switches 106 and 108 are preferably solenoid driven electromechanical switches. Current induced in the solenoid in one direction causes the switch to open; current induced in the opposite direction causes the switch to close.

In a preferred embodiment, microprocessor 102 is programmed to induce a current in the solenoids in response to commands received via communications module 120. For example, suppose disconnect switch 104 is open and the utility wishes to restore service to the subscriber location 12. The utility issues a connect command across the two-way communications path from the master station to the meter 100. The connect command is received by communications module 120 and delivered to microprocessor 102. In response, microprocessor 102 causes current to be delivered to the solenoids in a direction necessary to close the switches 106, 108.

Similarly, the utility can disconnect service remotely by issuing a disconnect command from the master station across the two-way communications path from the master station to the meter 100. The disconnect command is received by communications module 120 and delivered to microprocessor 102. In response, microprocessor 102 causes current to be delivered to the solenoids in a direction necessary to open the switches 106, 108. Thus, the utility can easily and cost effectively connect/disconnect service to a subscriber location without the need to send a human to the site.

Using a preferred embodiment of the present invention in which the meter includes a communications module, and in which the microprocessor is programmed to open and close the disconnect switch in response to commands from the utility's master station, the utility can also detect whether a subscriber whose power service has not been disconnected has tampered with the meter in order to route some, but not all, of the current around the current sensor. In this case, the utility remotely issues an open command to the meter at the subscriber location. The meter responds by opening the disconnect switch, thus eliminating the supply of electrical energy to the subscriber location. If a load-side voltage is still present (as detected by the load-side voltage sensor of the present invention), then a tamper condition exists (i.e., the subscriber has likely tampered with the circuit in such a way as to bypass the current sensor). The utility then remotely issues a close command, restoring power to the subscriber location. Preferably, such a test is conducted at a time when current usage is very low and the subscriber is unlikely to notice the disruption in service (e.g., in the middle of the night), and lasts for only a short duration. The utility can then take appropriate action upon detection of the tampering. Such a remote tamper detection approach vastly improves over the techniques currently used in the art.

While the invention has been described and illustrated with reference to specific embodiments, those skilled in the art will recognize that modification and variations may be made without departing from the principles of the invention as described hereinabove and set forth in the following claims.

We claim:

1. Apparatus for detecting tampering with an electrical energy meter, said meter metering electrical energy delivered from a voltage source via feeder lines to an electrical load at a subscriber location, said meter disposed between said voltage source and said electrical load, the apparatus comprising:

a disconnect switch, interposed into said feeder lines, for switching between an open circuit in which electrical energy is not supplied to said electrical load and a closed circuit in which electrical energy is supplied to said electrical load;

a load-side voltage sensor, which provides voltage signals indicative of load-side voltage on a side of said disconnect switch connected to said electrical load; and a microprocessor, responsive to said voltage signals, which determines whether a tamper conditions exists by:
   a) determining whether said disconnect switch is open or closed;
   b) determining whether said load-side voltage is present; and
   c) if said disconnect switch is open and said load-side voltage is present, indicating that a tamper condition exists.

2. The apparatus of claim 1, further comprising:

a communications module, connected to said microprocessor, for providing a two-way communications interface to a remote utility monitoring location, wherein, if said microprocessor determines that a tamper condition exists, said microprocessor transmits via said communications module to said remote utility monitoring location a message indicating that a tamper condition exists.

3. The apparatus of claim 2, wherein said disconnect switch is responsive to said microprocessor, said communications module receives open and close commands from said remote utility monitoring location, and said microprocessor opens or closes said disconnect switch in response to said open and close commands, respectively.

4. The apparatus of claim 2, wherein said communications module is a radio frequency transceiver.

5. The apparatus of claim 2, wherein said communications module is an interface to telephone lines located at said subscriber location.

6. The apparatus of claim 2, wherein said communication module is an interface to power lines located at said subscriber location.

7. A system for remotely detecting tampering comprising:
1) a meter which meters electrical energy delivered from a voltage source via feeder lines to an electrical load, said meter disposed between said voltage source and said electrical load, said meter comprising:
   a) a disconnect switch, interposed into said feeder lines, for switching between an open circuit in which electrical energy is not supplied to said electrical load and a closed circuit in which electrical energy is supplied to said electrical load;
   b) a load-side voltage sensor, which provides voltage signals indicative of load-side voltage on a side of said disconnect switch connected to said electrical load;
   c) a microprocessor, responsive to said voltage signals, which determines whether said disconnect switch is open or closed and whether said load-side voltage is present, said disconnect switch being responsive to said microprocessor; and
   d) a communications module, connected to said microprocessor, for providing a two-way communications interface; and
2) a remote utility monitoring location interfaced via a communications link to said communications module of said meter, said remote utility monitoring location issuing an open command to said meter to open said disconnect switch, receiving a signal from said communications module indicating whether a load-side voltage exists on a side of said disconnect switch connected to said electrical load; and if a load-side voltage exists while said disconnect switch is opened, said remote utility monitoring location indicating that a tamper condition exists.

8. A method of detecting tampering with an electrical energy meter, said meter metering electrical energy delivered from a voltage source via feeder lines to an electrical load at a subscriber location, said meter situated at a point between said voltage source and said electrical load and including a disconnect switch, interposed into said feeder lines, for switching between an open circuit in which electrical energy is not supplied to said electrical load and a closed circuit in which electrical energy is supplied to said electrical load, the method comprising the steps of:
   a) determining whether said disconnect switch is open or closed;
   b) determining whether a load-side voltage is present on a side of said disconnect switch connected to said electrical load; and
   c) if said disconnect switch is open and said load-side voltage is present, indicating that a tamper condition exists.

9. The method of claim 8, comprising the further step of:
   if a tamper condition exists, said meter communicating a message via a communications module to a remote utility monitoring location, said message indicating that a tamper condition exists.

10. A method of detecting tampering with an electrical energy meter, said meter metering electrical energy delivered from a voltage source via feeder lines to an electrical load at a subscriber location, said meter disposed between said voltage source and said electrical load, said meter having a communications module for two-way communications with a remote utility monitoring location and a disconnect switch interposed into said feeder lines, for switching between an open circuit in which electrical energy is not supplied to said electrical load and a closed circuit in which electrical energy is supplied to said electrical load, the method comprising the steps of:
   said remote utility monitoring location issuing an open command to said meter;
   said meter opening said disconnect switch in response to said open command;
   said meter determining whether a load-side voltage exists on a side of said disconnect switch connected to said electrical load;
   if a load-side voltage exists, said meter sending via said communications module an indicator to said remote utility monitoring location indicating that a tamper condition exists; and
   said meter closing said disconnect switch.

11. The method of claim 10, wherein said closing step comprises the steps of:
   said remote utility monitoring location issuing a close command to said meter; and
   said meter closing said disconnect switch in response to said close command.

\* \* \* \* \*